United States Patent [19]

Niwa et al.

[11] 4,315,159
[45] Feb. 9, 1982

[54] OPTICAL SENSOR DEVICE WITH REDUCTION OF AMBIENT LIGHT EFFECTS

[75] Inventors: Yukichi Niwa; Mitsutoshi Owada, both of Yokohama; Noriyuki Asano, Kawasaki; Masahiko Ogawa, Hino; Shuichi Tamura, Yokohama, all of Japan

[73] Assignee: Canon Kabushiki Kaisha, Tokyo, Japan

[21] Appl. No.: 41,503

[22] Filed: May 22, 1979

[30] Foreign Application Priority Data

May 25, 1978 [JP] Japan .................................. 53-63049

[51] Int. Cl.³ ............................................ H01J 40/14
[52] U.S. Cl. .................................. 250/578; 250/214 B
[58] Field of Search ............. 307/221 D, 311; 357/24, 357/30; 250/211 J, 578, 214 B

[56] References Cited

U.S. PATENT DOCUMENTS

| 3,806,729 | 4/1974 | Caywood | 250/211 J |
| 3,904,818 | 9/1975 | Kovac | 357/24 |
| 3,942,022 | 3/1976 | Stumpf et al. | 250/578 |
| 4,145,721 | 3/1979 | Beaudovin et al. | 250/578 |
| 4,155,094 | 5/1979 | Ohba et al. | 357/30 |

Primary Examiner—David C. Nelms
Attorney, Agent, or Firm—Toren, McGeady & Stanger

[57] ABSTRACT

An optical sensor device for use in optical instruments is disclosed. The optical sensor device is provided with an optical sensing region having at least one sensor element responsive to incident light for producing a charge, first and second charge storing regions each having the same number of charge storage elements as that of said sensor elements for accumulating the charges produced from said sensor elements, a first gate region for controlling the transfer of charge from said optical sensing region to said first charge storing region, and a second gate region for controlling the transfer of charges from the optical sensing region to the second charge storing region. Upon alternate application of a voltage to said first and second gate regions, the charges produced from said optical sensing region are alternately accumulated on said first and second charge storing regions.

9 Claims, 12 Drawing Figures

F I G. 5
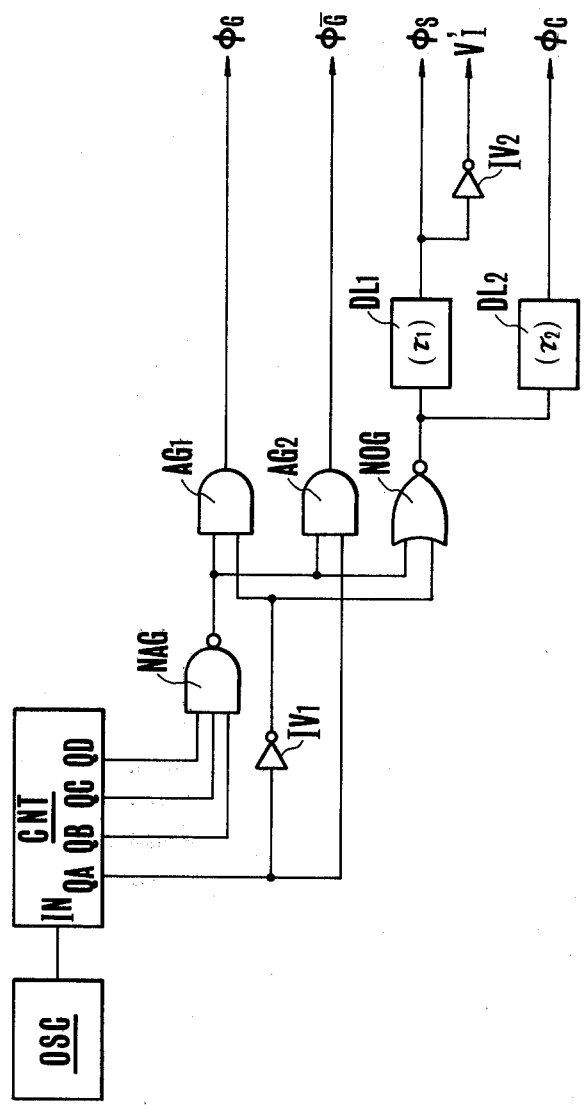

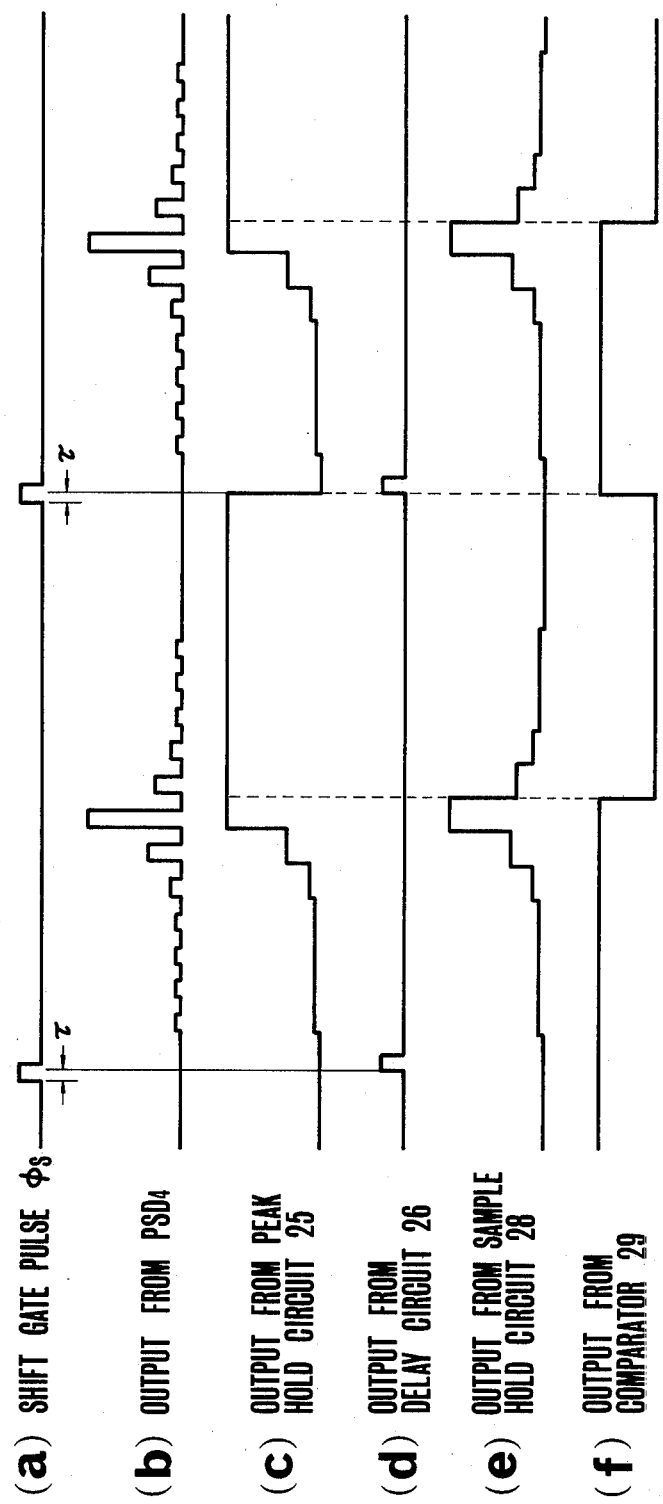

OPTICAL SENSOR DEVICE WITH REDUCTION OF AMBIENT LIGHT EFFECTS

BACKGROUND OF THE INVENTION

This invention relates to optical sensor devices, and, more particularly, to optical sensor devices of the charge storage type having functions of generating a charge corresponding to incident light and of storing this charge in a suitable site. Such devices are known, for example, as CCD photo-sensors, or CCD photo-diodes which are formed by combining CCDs with photo-diodes.

Recently, a remarkable advance in the semi-conductor art has been achieved, so that charge store type optical sensor devices such as CCD photo-sensors and CCD photo-diodes are available at a very low price. Further, these days, attempts are made here and there to utilize such optical sensor devices in a wide variety of optical instruments.

For example, speaking of the field of distance measurement of a target object, it is proposed that doubled images of an object are formed by the base line distance meter type optical system and then optically scanned by a linear type optical sensor device to produce an output signal representative of the amount of relative discrepancy of these two images, from which the object distance is to be recognized, such as, for example, disclosed in Japanese Patent Laid-Open Specification Nos. Sho 51-45556 and Sho 52-153433, and U.S. Pat. No. 4,004,852. In this sort of apparatus, the particular use of the optical sensor device will lead to an increase in the accuracy of measurement of a distance to the object.

Aside from this, speaking of the field of in-focus detection of an image forming optical system for a given object, instead of using, for example, a photoconductive element having non-linear light response characteristics such as CdS or CdSe receptive of an object image formed by said optical system for producing an output signal which is then utilized in detecting the sharpest focus of image, that is, the in-focus condition, it is made possible to use a linear type optical sensor device which is positioned to electrically scan the above described image with the concurrent image scanning output providing a peak envelope from which a condition of sharpest focus of the image. That is, the in-focus thereof is detected, as disclosed in Japanese Patent Laid-Open Specification No. Sho 54-45127 assigned to the applicant of the present invention. Even in this sort of apparatus, by utilizing the optical sensor device the result is that the condition of in-focus of the image forming optical system can be detected with high accuracy.

The theme of this will now be changed. In these fields of distance measurement and in-focus detection, it is known besides the so-called passive type apparatus which utilizes the light emanating from the object itself in performing the distance measurement or in-focus detection to provide a so-called active type apparatus having a light projector incorporated therein in combination with an optical-electronic detector receptive of the reflected light from the object illuminated with the light projected from the projector for producing an output signal representative of the distance to the object, or the sharpness of an object image formed by the optical system. In the latter connection there have been a great number of proposals made.

A typical example of the active type distance measuring apparatus adapted to associate with an automatic distance adjusting system in a photographic camera is disclosed in Japanese Patent Laid-Open Specification No. Sho 49-49625 assigned to the applicant of the present invention, where, for the photoelectric means receptive of the reflected light from the above mentioned target object, use is made of a plurality of photosensitive elements independent of one another and arranged in predetermined base line intervals from the light projector to correspond to respective different object distances. Upon analysis of the condition of output of the photoelectric light receptor means, detection is made of which photosensitive element receives the reflected light from the target object to evaluate the distance to the target object.

According to another feature of this proposal, when the light projector is rendered operative to project light onto the target object, the concurrent outputs of the individual photosensitive elements are memorized in respective condensors. Then, the light projection is interrupted with production of concurrent outputs from the individual photosensitive elements which are compared with those memorized on the individual condensors to obtain differences therebetween through respective differential amplifiers. Upon detection of which differential amplifier produces an effective output, as to which photosensitive element among the above described plurality of photosensitive elements receives the reflected light from the target object is determined, the distance to the target object is recognized.

It will be appreciated that according to this method, it is possible to effectively remove the influence of the other or ambient light than the projection light (that is, the ambient light functions as the disturbing light in this sort of apparatus, causing the accuracy of distance measurement to be considerably lowered). Thus, it may be expected that the accuracy of distance measurement would be improved.

The apparatus of this proposal is, however, associated with many points requiring further improvements. For one point, since the photosensitive elements are made of a photoconductive material such as CdS, and an electrical circuit arrangement includes resistors connected to the respective individual photosensitive elements with their junction points, that is, voltage dividing points connected to the respective memory condensors, while the differential amplifiers are fed at one of their inputs with the memorized voltages from the individual condensors and at their other inputs with the voltages from the individual junction points, as each condensor memorizes the voltage determined by the resistance value of the respective photosensitive element, the intensity of light projected from the light projecting means must be large enough to insure that the output voltage is of satisfactory operating level for detection.

Particularly in application to a small instrument such as a camera whose electrical power source capacity is limited, therefore, many problems are left yet unsolved. Again, along therewith, in a lighting situation where the environment is very bright, when the light projection is interrupted, the concurrent voltage at the above described voltage dividing junction point becomes very high due to the influence of the ambient light. As a result, the level of the noise component is increased with considerable decrease in the output level of the differential amplifier. There will be a high possibility of encountering the photographic situation where the distance cannot be measured. In another situation where the environmental illumination varies to a large extent from a moment at which light has been projected to a moment at which the light projection is interrupted, as no means is provided to compensate for the variation of the environmental illumination, faulty operation will be possible.

An attempt has been made to overcome all the above mentioned drawbacks of the apparatus of the above described proposal by using a charge storage type optical sensor device according to the present invention which will be described later. It has now been found that the features characteristic of the apparatus are further improved.

In greater detail, the charge storage type optical sensor device is constructed from an optical sensing region having, for example, a plurality of photosensitive elements responsive to incident light for generating charges individually and is provided with first and second charge storage regions each having the same number of charge storage elements as that of photosensitive elements in combination with first and second control gate regions positioned between the optical sensing region and the first and second charge storage regions, respectively, to control the transfer of the charges from the optical sensing region to the first and second charge storage regions. Such device is substituted for the above-described photoelectric light receiving means and the memory condensor arrangement, wherein while the above-described light projecting means is pulsed to produce intermittent lights of a constant period, the above-described first and second control gate regions are controlled to permit the transfer of those of the charges produced from each of the sensor elements in the optical sensing region which occur when light is projected from the light projecting means through the first control gate region to the corresponding one of the charge storage elements in the first charge storing region, while those of the charges produced from each of the sensor elements in the optical sensing region which occur when no light is projected from the light projecting means are transferred to and accumulated on the corresponding one of the charge storage elements in the second charge storing region after having passed through the second control gate region. Thus, the first charge storing region stores a succession of charges representative of the reflected light from the target object illuminated with the projection light and the ambient light, and the second charge storing region stores a succession of charges representative of the light coming from the target object illuminated with the ambient light alone, so that in suitable timed relationship, the charges accumulated on the first and second charge storing regions may be read out for each pair of charge storage elements correlated to each other with respect to the individual sensor element in the first and second charge storing regions to produce electrical signals with a difference therebetween being obtained through a respective differential circuit, thereby it being made possible to detect a signal dependent upon only the projected light from the apparatus with a very high accuracy.

Particularly in this case, since the accumulation of the successive charges leads to effect integration and memorization of information, even when the light energy projected is very weak, a signal whose level is high enough to assure accurate detection can be obtained. Therefore, the detection performance of the apparatus as a whole is further improved, and the detectable range is further extended toward further distances. Again, because of the perfect removal of the noise component due to the ambient light, when the environment is very bright, or even when the environmental illumination varies to a large extent on the way, the satisfactory detection performance can be assured. Thus, the intrinsic merit of the apparatus according to this proposal is further improved to always accomplish accurate detection of the distance.

Besides the above, and functioning as this sort of active type of distance measuring or automatic in-focus detecting apparatus, there is also known, for example, an automatic distance detecting apparatus in Japanese Patent Publication No. Sho 52-19091, where using photoelectric light receiving means responsive to incident light for producing an electrical output which varies with variation of said incident light in position on the light receiving surface thereof, after light is projected from the light projecting means onto a target object, two beams of the reflected light from the target object which are incident in a common plane at respective different positions corresponding to the distance to the target object are allowed to alternately impinge upon said light receiving means with production of those of the outputs therefrom which correspond to one of the incident light beams upon comparison with the other outputs which correspond to the other incident light beam to produce a level difference dependent output which is then used to detect the distance to the above-described target object. Further, as proposed in U.S. Pat. No. 3,999,192 to the applicant of the present invention, after light is projected from the light projecting means, the reflected light from the object is received by two photoelectric elements which are arranged so that their boundaries are adjacent to each other after having passed through a movable light modulating means by which the reflected light is brought to incidence at the interface region between the above-described two photoelectric elements. By the position of the above-described light modulating means which occurs when the difference between the outputs of the two photoelectric elements becomes zero, the distance to the object can be measured.

In addition to such automatic distance detecting apparatus, there is known an automatic in-focus detecting apparatus in which the above-described light modulating means is made to cooperate with a photo-taking optical system in such a manner that the condition of in-focus of an object image formed by said optical system can be detected. A charge store type optical sensor device to be described below may even be applied to such apparatus as the photoelectric light receiving means thereof, thereby giving an advantage that the detection performance is further improved.

With regard first to the apparatus proposed in Japanese Patent Publication No. Sho 52-19091, instead of the above-described photoelectric light receiving means, it is possible to use the charge storage type optical sensor device with the above-described optical sensing region, and the first and second charge storing regions each having, for example, only one element in combination with a masking means or an ND filter of continuous variation in density arranged so that the magnitude of charge generated in response to the incident light varies with variation of the incident light in position on the light receiving surface thereof. To effect an equivalent result to that with the alternate impinging of the two beams of the reflected light on the light receiving surface, the first and second control gate regions are alternately pulsed to permit the ones of the charges produced from the sensor element which correspond to one of the two incident light beams to be transferred to and accumulated on the first charge storing region, while the other charges which correspond to the other incident light beam are transferred to and accumulated on the second charge storing region. Then, in appropriate timed relationship, the first and second charge storing regions are actuated to take out the charges stored thereon in the form of electrical signals, and then a difference between the signals is obtained through a differential circuit.

Thus, even in this case, since the successive accumulation of charges leads to effect integration and memorization of information, even when the energy of the projected light is very weak, the output of the photoelectric means serves as a signal of satisfactory level for detection. Therefore, the detection performance of the apparatus as a whole not only is further improved, but also the range of object distances for which the detection is possible is extended toward longer ones. Again, no matter how small the difference between the incident points of the two beams of the reflected light on the light receiving surface of the sensor element may be, there results in an appreciable difference being created between the magnitudes of output of the first and second charge storing regions to facilitate further improvement of the accuracy of detection.

With regard to the latter apparatus proposed in U.S. Pat. No. 3,999,192, the above-described photoelectric light receiving means is substituted for by a charge storage type optical sensor device with the above-described optical sensing and first and second charge storing regions each having, for example, two elements, whereby, while the light projecting means is pulsed to produce intermittent lights of a constant period as has been mentioned in connection with the apparatus in Japanese Patent Laid-Open Specification No. Sho 49-49625, the gating operation of the first and second control gate regions is controlled alternately in synchronism with the frequency of projection of light to permit the charges produced from the individual sensor elements to be transferred to and accumulated on the first and second charge storing regions in separation from each other depending upon whether or not light is projected. Then, in appropriate timed relationship, the charges stored on the first and second charge storing regions are read out for each of the two pairs of charge storage elements related to each other with respect to the individual sensor elements in the first and second charge storing regions, and are then compared with each other to obtain differences through respective individual differential amplifiers.

Upon detection of whether or not the outputs of these two differential amplifiers coincide with each other, it is possible even in this case to effect an equivalent result to that with the apparatus in Japanese Patent Laid-Open Specification No. Sho 49-49625. Moreover, if however a small difference occurs between the amounts of light received by the two sensor elements, the outputs of the two differential amplifiers clearly differ from each other, thus the accuracy of detection is further improved.

SUMMARY OF THE INVENTION

An object of the present invention is to provide an optical sensor device which overcomes all the above-mentioned drawbacks of the conventional sensor device.

Another object of the present invention is to provide a novel optical sensor device capable, upon response to two optical signals, of allowing for the respective integrated outputs to be read out in separation.

BRIEF DESCRIPTION OF THE DRAWINGS

FIG. 5 is an electrical circuit diagram illustrating an example of a timing circuit for producing the various signals of FIG. 3.

FIG. 12 is a timing chart showing a manner in which the circuitry of FIG. 11 may operate.

DESCRIPTION OF THE PREFERRED EMBODIMENTS

Figure 1:
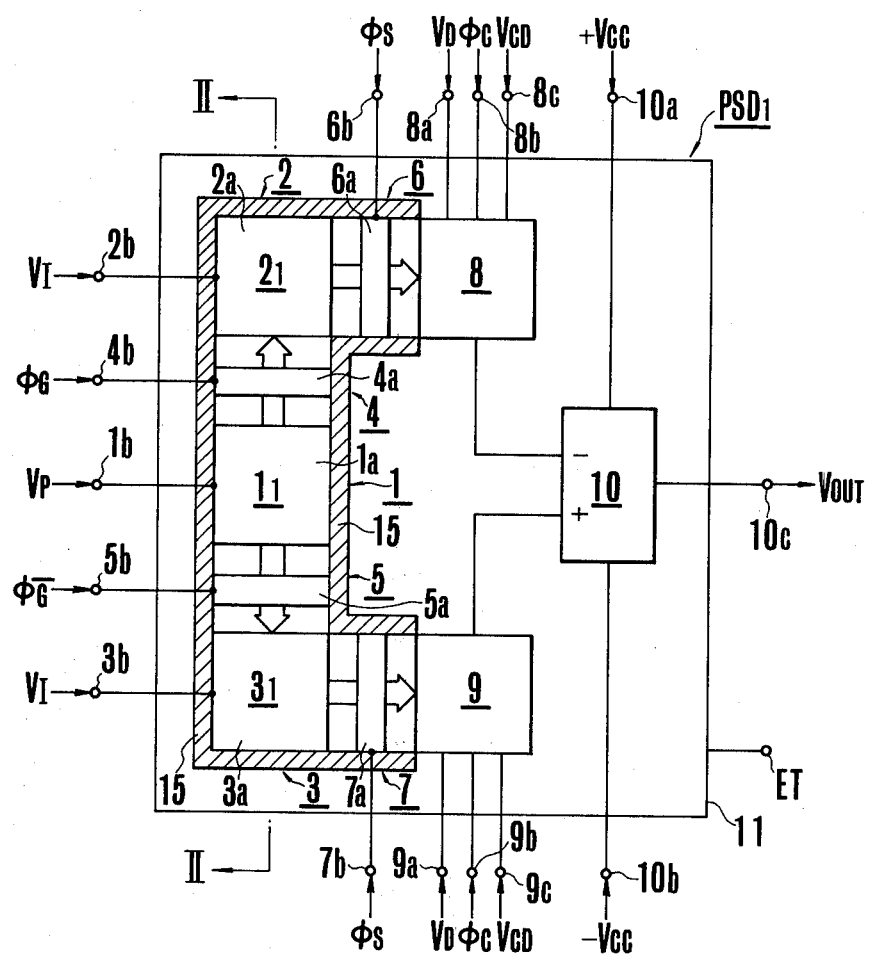
FIG. 1 is a schematic diagram showing a first embodiment of an optical sensor device according to the present invention.

In the following, a number of preferred embodiments of the present invention will be described with reference to the accompanying drawings. Though all the embodiments are illustrated taking CCD for an example, it is to be understood that besides this approach, the principles of the present invention are readily applicable to like devices such as CCD photo-diodes and photo-diode arrays.

Referring first to FIGS. 1 to 4, there is shown a first embodiment of the present invention where the number of sensor elements in the optical sensing region is limited to one. By reference to FIG. 1, the construction and arrangement of the various portions of an optical sensor device will first be described. In the figure, the device is indicated at $PSD_1$. 1 is an optical sensing region responsive to incident light for generating a charge, and defined here to have one sensor element $1_1$. $1a$ is an electrode of the optical sensing region 1, and $1b$ is a voltage supply terminal connected to said electrode $1a$ and to which is applied a photo-gate voltage VP (shown on line (a) in FIG. 3) to create a potential well in the sensor element $1_1$; 2 and 3 are first and second charge storing regions respectively for storing the charge produced from the optical sensing region 1 and having storage elements $2_1$ and $3_1$ one in each region for correspondence with one sensor element $1_1$; $2a$ is an electrode of the first charge storing region 2 and 2b is a voltage supply terminal connected to said electrode 2a; 3a is an electrode of the second charge storing region 3 and 3b is a voltage supply terminal connected to said electrode 3a. Applied to these terminals 2b and 3b is a voltage VI (shown on line (b) in FIG. 3) to create a potential well in each of the first and second storage elements $2_1$ and $3_1$; 4 and 5 are first and second control gate regions arranged respectively between the optical sensing region 1 and the first charge storing region 2 and between the optical sensing region 1 and the second charge storing region 3 to control the transfer of the charge produced from the optical sensing region 1 to either of the first and second charge storing regions; 4a is an electrode of the first control gate region 4 and 4b is a voltage supply terminal connected to said electrode 4a; 5a is an electrode of the second control gate region 5 and 5b is a voltage supply terminal connected to said electrode 5a. Applied to these terminals 4b and 5b are gate pulses $\phi G$ and $\phi \overline{G}$ respectively (shown on lines (c) and (d) in FIG. 3); 6 and 7 are first and second shift gate regions respectively for taking off the charges stored on the first and second charge storing regions 2 and 3; 6a is an electrode of the first shift gate region, and 6b is a voltage supply terminal connected to said electrode 6a; 7a is an electrode of the second shift gate region 7, and 7b is a voltage supply terminal connected to said electrode 7a. Applied to these terminals 6b and 7b is a gate pulse $\phi S$ (shown on line (e) in FIG. 3); 8 and 9 are first and second pre-amplifying regions for converting the stored charges taken off from the first and second charge storing regions 2 and 3 through the shift gate regions 6 and 7 to voltages which may be of the floating diffusion amplifier type (FDA type) consisting of a MOS-FET for signal output and a MOS-FET for charge clear; 8a, 8b and 8c are voltage supply terminals of the first pre-amplifying region 8; 9a, 9b and 9c are voltage supply terminals of the second pre-amplifying region 9.

Figure 3:
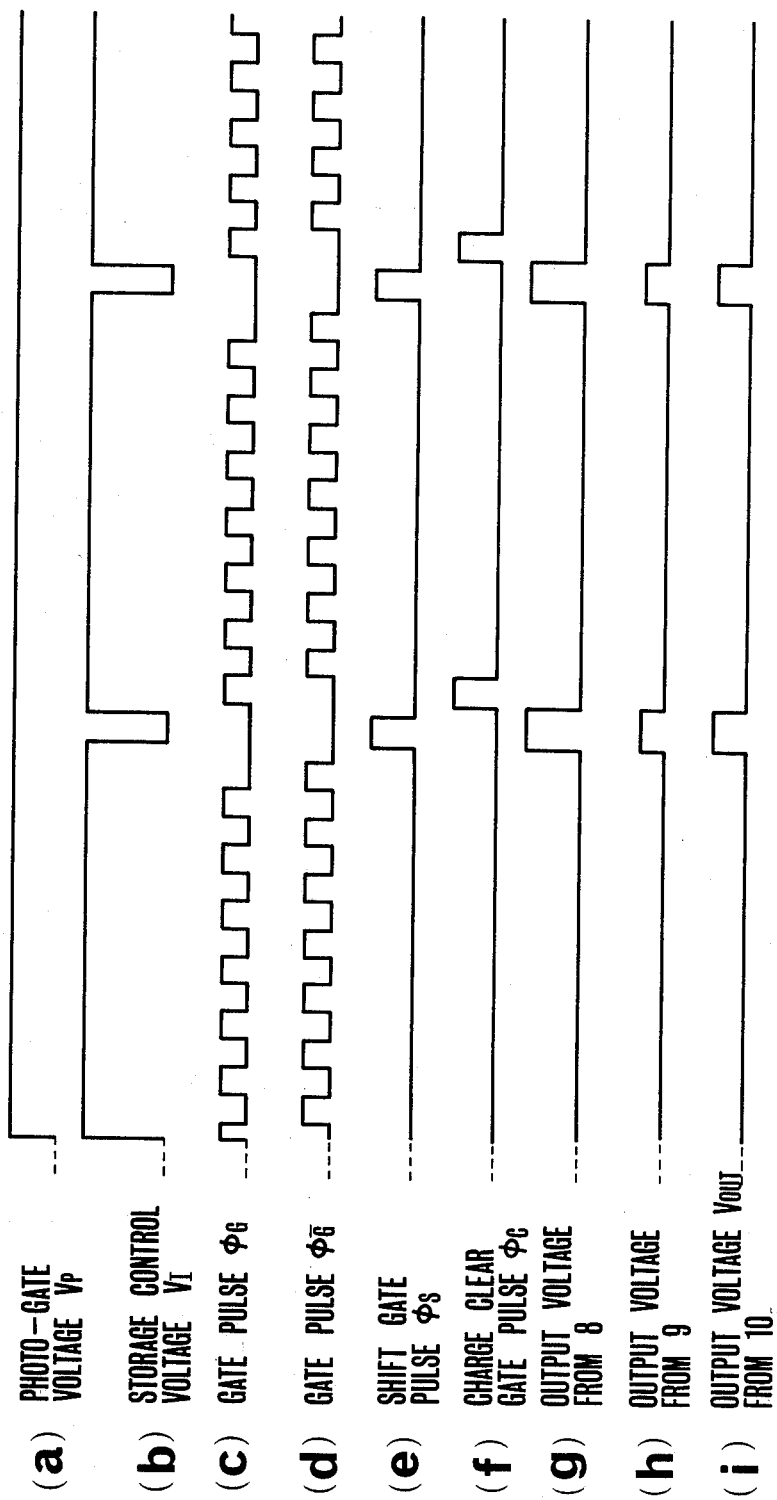
FIG. 3 is a timing chart of the various signals necessary to drive the optical sensor device of FIG. 1.
Figure 4:
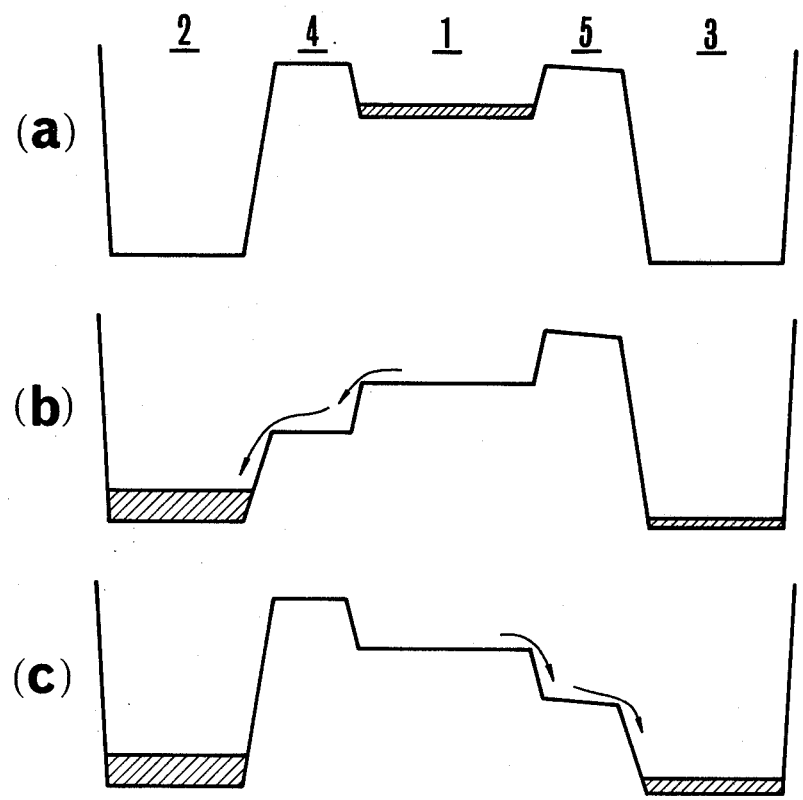
FIG. 4 is schematic diagrams illustrating variations of the internal potential in the sectional plane shown in FIG. 2 as the optical sensor device of FIG. 1 is driven.

An output transistor drain voltage VD is applied to the terminals 8a and 9a, a gate pulse $\phi C$ (shown on line (f) in FIG. 3) for the gate of the charge clear FET to the terminals 8b and 9b, and a CCD drain voltage VCD for the charge clear FET to the terminals 8c and 9c. As is known in the art, these pre-amplifying regions 8 and 9 are similar to those in the commonly available CCD, and therefore description does not go further beyond the block form scheme. 10 is a differential amplifying region constructed, for example, in MOS form to obtain a difference between the outputs of the first and second pre-amplifying regions 8 and 9 with its non-inversion input connected to, for example, the output of the first pre-amplifying region 8 and with its inversion input connected to, in this instance, the output of the second pre-amplifying region 9; 10a and 10b are voltage supply terminals of the differential amplifying region 10, and 10c is an output terminal thereof. To the terminals 10a and 10b are applied voltages +VCC and −VCC respectively. The output voltage of the differential amplifying region 10 appears at the terminal 10c. Though the differential amplifying region 10 is illustrated as constructed in on-chip form, it is of course possible to construct it in separate chip form from the optical sensor device unit $PSD_1$. Since this is similar to a commonly available differential amplifier which may be fabricated in IC form, no further description is made except for the illustration of the blocks. 15 is a channel stopper for preventing diffusion of the potential wells formed in such portions of the device as shown by the oblique lines in the figure. ET denotes an earth terminal connected to a substrate of the optical sensor device.

Figure 2:
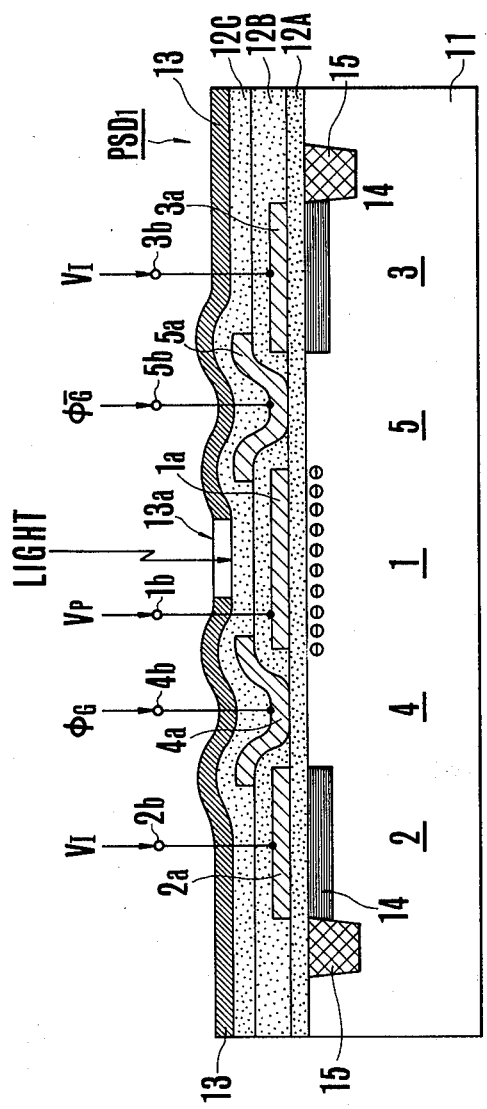
FIG. 2 is a sectional view taken along II—II line of FIG. 1 to illustrate the internal structure of the essential parts of the optical sensor device of FIG. 1.

Description is next given to the cross-sectional structure of the optical sensor device $PSD_1$ particularly at the optical sensing region 1, control gate regions 4 and 5 and charge storing regions 2 and 3 by reference to FIG. 2. In this figure, 11 is the substrate of the optical sensor device $PSD_1$, for example, P type Si; 12A is a first insulating layer of $SiO_2$ formed on said substrate 11 by CVD (chemical vapor deposition-high temperature oxidation) technique or the like, and the above-described sensing region electrode 1a and storing region electrodes 2a and 3a are formed as N+ polycrystal Si layers on the first insulating layer 12A; 12B is a second insulating layer of the same material $SiO_2$ formed on the first insulating layer 12A so as to cover these electrodes 1a, 12a and 3a. To provide the above-described gate region electrodes 4a and 5a, the second insulating layer 12B is removed in portions by photo-etching means or the like, and then an N+ polycrystal Si thin layer is deposited over the etched recesses; 12C is a third insulating layer of the same material or $SiO_2$ formed on the second insulating layer 12B so as to cover these electrodes 4a and 5a; 13 is a light shielding layer formed as a thin layer of metal such as Al by vacuum deposition technique on all the surface of the third insulating layer 12C except for an area 13a corresponding to the electrode 1a. This area 13a of the light shielding layer 13 is removed by photo-etching techniques to provide a window 13a for the incident light; 14 represents N+ areas formed by diffusion with phosphorous or any other suitable dopant within the P type Si substrate 11 in the areas corresponding to the electrodes 2a and 3a, so that the potential well in each storage element $2_1$, $3_1$ is made asymmetric to that in the other. The above-described channel stoppers 15 are formed by doping impurities into the substrate 11, being P+ areas with respect to the P type Si. The internal structure of each of the shift gate regions 6 and 7, though not shown here, is similar to that of the control gate regions 4 and 5.

It is noticed that the thickness of the above-described electrode 1a in the optical sensing region is usually in the order of about 400 nm so as to transmit the visible light region, but by suitably modifying this thickness it is made possible to select a desired spectral region of wavelengths for use as the projection light, for example, infrared, or near infrared light, for which the thickness must be increased from the usual one.

Description will next be given to the operation of the optical sensor device $PSD_1$. But, here let us list voltage value models of the above-described various signals VP, VI, $\phi G$, $\phi \overline{G}$, $\phi S$, VD, $\phi C$, VCD and VCC necessary to drive the optical sensor device.

|  | volts |
|---|---|
| Photo-gate voltage VP | 4 |
| Storing region voltage VI | 8 |
| Clock voltage (at high level) of gate pulse $\phi G$, $\phi \overline{G}$ | 2 |
| Clock voltage (at high level) of shift gate pulse $\phi S$ | 4 |
| Output stage transistor drain voltage VD | 20 |
| Clock voltage (at high level) of gate pulse $\phi C$ for charge clear | 4 |
| CCD drain voltage VCD | 6 |
| Supply voltage ± VCC to the difference amplifying region 10 | ±5–15 |

It is noticed that these values are based upon the voltage of the substrate, and, of these signals, the VI, $\phi G$, $\phi \overline{G}$, $\phi S$ and $\phi C$ must not take their low level voltage below 0.0 volt likewise as in the general CCD.

In operating the device of such construction, now assuming that the optical sensing region 1 and the first and second charge storing regions 2 and 3 are supplied through the respective terminals 1b, 2b, and 3b with the voltages VP and VI respectively shown in FIGS. 3(a) and 3(b), then these optical sensing, charge storing regions 1, 2 and 3 have potential wells created in the sensor element $1_1$ and storage elements $2_1$ and $3_1$ respectively as shown in FIG. 4(a) (where, because of the provision of the N+ areas 14 corresponding to the areas of the storage elements $2_1$ and $3_1$, the potential wells in the storage elements $2_1$ and $3_1$ are deeper than the potential well in the sensor element $1_1$, thus being asymmetric to the latter). Then, when light enters through the window 13a for incident light, the optical sensing region 1 generates a charge corresponding thereto, and this is stored in the potential well in the sensor element $1_1$ as shown in FIG. 4(a). During this time, if a predetermined voltage is previously applied to, for example, the first control gate region 4 through the terminal 4, a potential well (which is deeper than that in the sensor element $1_1$, and shallower than that in the storage element $2_1$) is created to provide a potential gradient from the optical sensor region 1 down to the charge storing region 2. Thus, the concurrently generated charge in the sensor element $1_1$ is allowed to flow through the first control gate region 4 to the first charge storing region 2 and is stored in the potential well in the storage element $2_1$ as shown in FIG. 4(b).

Next, when the supply of voltage is cut off from the first control gate region 4, and is given through the terminal 5b to the second control gate region 5, a reversed result is effected at this time as shown in FIG. 4(c), as a potential well (which is deeper than that in the sensor element $1_1$ and similarly with the first control gate 4 and shallower than that in the second storage element $3_1$) is created to provide a potential gradient from the optical sensing region 1 to the second charge storing region 3, so that the concurrently generated charge in the sensor element $1_1$ is at this time directed to flow through said second control gate region 5 into the second charge storing region 3 and is stored in the potential well in the storage element $3_1$ (the resultant state is shown in FIG. 4(c).

Therefore, while the voltages VP and VI are applied to the optical sensing region 1 and the charge storing regions 2, 3 respectively, the application of the gate pulse trains $\phi G$ and $\phi \overline{G}$ through respective terminals 4b and 5b to the first and second control gate regions 4 and 5 respectively causes the creation and cancellation of the potential wells in these control gate regions 4 and 5 to alternate in opposite relation to each other. Thus, a continuous succession of charges produced from the optical sensing region 1 are alternately taken out into the first and second charge storing regions 2 and 3, and accumulated in each of the storage elements $2_1$ and $3_1$. Then, after the alternate transfer of the charge produced from this optical sensing region 1 to the first and second charge storing regions 2 and 3 has repeated itself a number of times, the shift gate pulse $\phi S$ shown in FIG. 3(e) is applied in appropriate timed relationship to the first and second shift gate regions 6 and 7 through the terminals 6b and 7b, and, in synchronism therewith, the voltage VI on the first and second charge storing regions 2 and 3 is made to temporarily fall to the low level, whereby while potential wells are formed in the first and second shift gate regions 6 and 7, the potential wells in the storage elements $2_1$ and $3_1$ are cancelled to permit the accumulated and stored charges on the storage elements $2_1$ and $3_1$ to be taken out. It is noted that when the charges are taken out, the gate pulses $\phi G$ and $\phi \overline{G}$ are maintained at the low level as shown in FIGS. 3(c) and 3(d), or otherwise the charges on the storing regions 2 and 3 would flow backward to the optical sensing region 1, as the potential wells are formed in the control gate regions.

After having been taken out through these shift gate regions 6 and 7, the charges stored on the storing regions 2 and 3 flow into the first and second pre-amplifying regions 8 and 9 respectively, and at this time the source of the signal output FET in each of these pre-amplifying regions 8 and 9 produces a voltage proportional to the amount of current which flows into the respective individual pre-amplifying regions 8 and 9. Then, these concurrent outputs of the pre-amplifying regions 8 and 9 are applied to the differential amplifier region 10 having an output representative of the difference therebetween. This output appears at the terminal 10c.

Therefore, if the amount of light received by the optical sensing region 1 during the time when taken out into the first charge storing region 2 (that is, when the gate pulse $\phi G$ to the first control gate region 4 remains at the high level) differs from that received by the optical sensing region 1 during the time when taken out into the second charge storing region 3 (that is, when the gate pulse $\phi \overline{G}$ to the second gate region 5 remains at the high level), for example, if the former light amount is larger than the latter, the amount of charge stored on the first charge storing region 2 is larger than that stored on the second charge storing region 3, and, therefore, the output voltage of the first pre-amplifying region 8 is higher than the output voltage of the second pre-amplifying region 9. This causes the differential amplifying region 10 to produce an output voltage corresponding to the difference between the output voltages of the both pre-amplifying regions 8 and 9, as shown in FIG. 3(i).

Then, after that, in appropriate timed relationship, the shift gate pulse to the shift gate regions 6 and 7 is allowed to return from the high to the low level, and, in synchronism therewith, the voltage VI to the charge storing regions 2 and 3 is allowed to return from the low level to the above-described predetermined voltage level, whereby while the potential wells in the shift gate regions 6 and 7 are cancelled, the charge storing regions 2 and 3 form potential wells again. After that, therefore, when the gate pulses $\phi G$ and $\phi \overline{G}$ are again applied to the control gate regions 4 and 5, the above-described operation is repeated again.

It is noticed that after the charges stored on the charge storing regions 2 and 3 have been taken out, the charge clear gate pulse $\phi C$ is applied in appropriate timed relationship to the pre-amplifying regions 8 and 9 as shown in FIG. 3(f), thereby the charges flowing in said pre-amplifying regions 8 and 9 are caused to enter the respective drains of the charge clear FETs in said pre-amplifying regions 8 and 9. As is understood from FIGS. 3(e)-3(h), the period of output of the pre-amplifying regions 8 and 9 is a time interval from the rising of the shift gate pulse $\phi S$ to the rising of the charge clear gate pulse $\phi C$.

Explanation is here given to a timing circuit for producing the above-described signals VI, $\phi G$, $\phi \overline{G}$, $\phi S$ and $\phi C$ necessary to control the drive of the above-described optical sensor device $PSP_1$. FIG. 5 shows an example of this timing circuit. In this figure, OSC is an oscillator for producing a clock pulse train; CNT is a binary counter (said counter CNT is of the falling synchronization type for counting the output pulses from said oscillator OSC; NAG is a NAND gate for taking the NAND condition of the output PB, QC and QD of said counter CNT; AG$_1$ is an AND gate for taking the AND of the output of said NAND gate NAG and the inverted output QA of the counter CNT by an inverter IV$_1$; AG$_2$ is an AND gate for taking the AND of the output of said NAND gate NAG and the output QA of the counter CNT; NOG is a NOR gate for taking NOR for taking the output of the NAND gate NAG and the output of the inverter IV$_1$; DL$_1$ is a delay circuit for delaying the output of said NOR gate NOG by a time $\tau_1$; IV$_2$ is an inverter for inverting the output of said delay circuit DL$_1$; DL$_2$ is a delay circuit for the output of the NOR gate NOG by a time $\tau_2$ (where $\tau_2 > \tau_1$).

Figure 6:
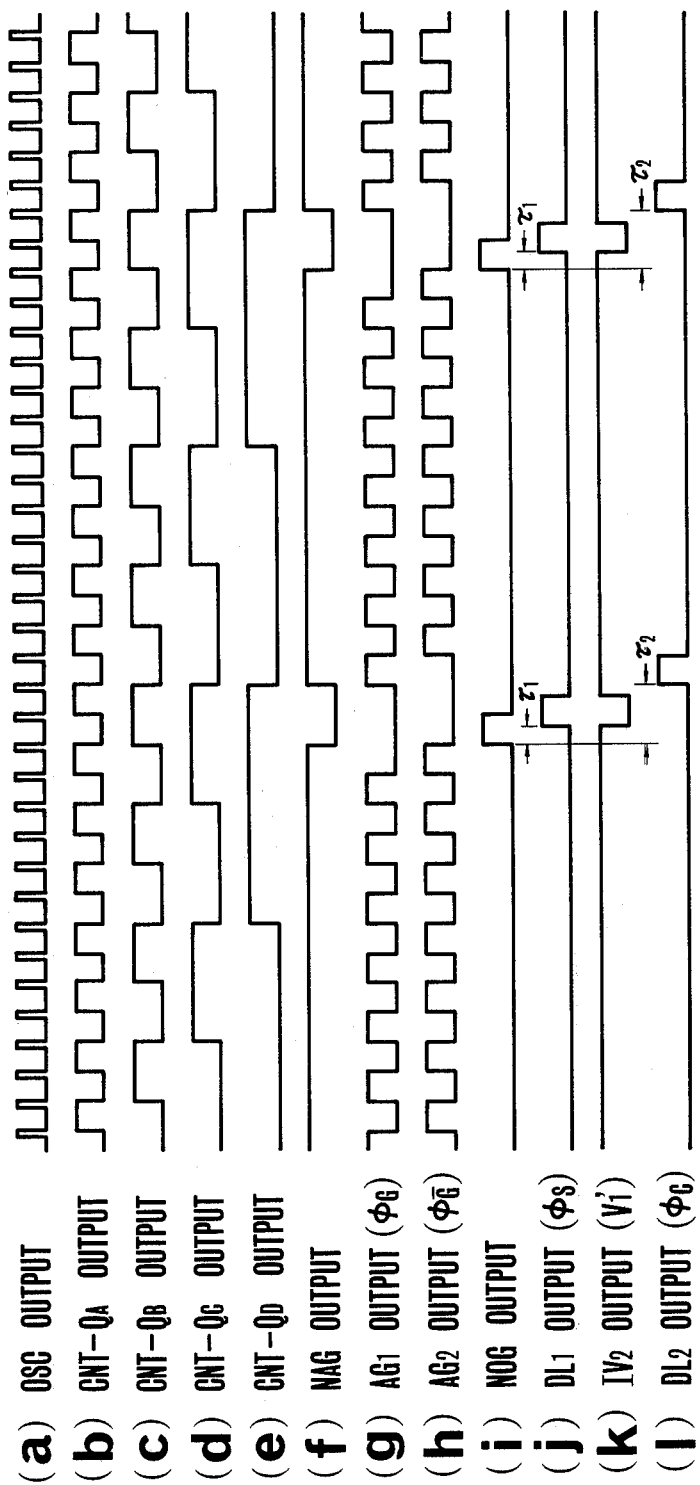
FIG. 6 is a timing chart illustrating a manner in which the circuit of FIG. 5 may operate.

In operating the circuit of FIG. 5, the oscillator OSC is actuated to oscillate with production of the clock pulse train shown in FIG. 6(a), which are counted by the counter CNT. As the outputs QA, QB, QC and QD change as shown in FIGS. 6(b), (c), (d) and (e), therefore, the NAND gate NAG produces an output as shown in FIG. 6(f). At this time, therefore, the AND gates AG1 and AG2 produce outputs as shown in FIG. 6(g) and (h) respectively, and the NOR gate NOG produces an output as shown in FIG. 6(i). At this time, the delay circuit DL$_1$ produces an output delayed from the output of the NOR gate NOG by the time $\tau_1$, and the inverter IV$_2$ produces an output as shown in FIG. 6(k). On the other hand, the delay circuit DL$_2$ produces an output delayed from the output of the NOR gate NOG by the time $\tau_2$ as shown in FIG. 6(l).

Therefore, the above-described various outputs from the AND gates AG$_1$, AG$_2$, delay circuit DL$_1$, inverter IV$_2$ and delay circuit DL$_2$ may be utilized as standard timing signals $\phi$G, $\phi\overline{G}$, $\phi$S, VI and $\phi$C in obtaining the gate pulses $\phi$G, $\phi\overline{G}$, shift gate pulse $\phi$S storage control voltage VI and charge clear gate pulse $\phi$C respectively after the voltages of these signals have been adjusted to, for example, the above-described list of voltage value models.

It is noticed that in the above embodiment, the number of cycles of alternate charge transferring operation from the optical sensing region 1 to the first and second charge storing regions 2 and 3 before the stored charges are taken out from the regions 2 and 3 is more than one, but may be, of course, only one, and the period for each cycle may take any value. Further, in this embodiment, the gate pulses $\phi$G, $\phi$G to the control gate regions 4 and 5 are defined to have a wave form of 50% duty cycle as shown in FIGS. 3(c) and (d), so that, in a sense of the potentials shown in FIG. 4, a succession of steps (b)→(c)→(b)→(c)→ . . . is effected. For these gate pulses $\phi$G, $\phi\overline{G}$, use may be made of the pulses of the oscillator OSC shown in FIG. 6(a) though the duty is less than 50%, provided only that the timing is suited therefor. If so, as the charge generated is allowed to stay in the potential well in the sensor element l$_1$ for a time, the step succession becomes (a)→(b)→(a)→(c)-→(a)→(b)→ . . . .

It is noticed that the foregoing description may apply to the following embodiments of the present invention. Since the first embodiment of the optical sensor device according to the present invention has the function and constructional features as explained above, it will be appreciated that such optical sensor device PSD$_1$ is very suitable for use with, for example, the above-described automatic distance detecting apparatus in Japanese Patent Publication No. Sho 52-19091. In more detail, the above-described optical sensor device PSD$_1$ is used as the photo-electric light receptor in combination with, for example, a mask having a triangle opening, or an ND filter strip whose density varies with the length as arranged in front of the window 13a in the light shielding layer 13 of the optical sensor device, so that, as the object distance is varied, the points of incidence of the two light beams on the light receiving surface are varied, causing the charge generated in the optical sensing region 1 by one light beam to differ in magnitude from that due to the other light beam (this is commonly called the position sensing function). At the same time, the frequency of the clock pulses from the oscillator OSC of FIG. 5 is adjusted to correspond with the chopping period for alternate selection of said two light beams for incidence on the surface of the region 1 by the rotary chopper. Thus, each of the two light beams is made incident on the optical sensing region 1 in time sequence with a first succession of charges transferred from the optical sensing region 1 to the first charge storing region 2 and a second succession of charges to the second charge storing region 3. Then, in appropriate timed relationship, the voltages corresponding to the amounts of charge accumulated on the first and second charge storing regions 2 and 3 are applied to the differential amplifier to obtain a voltage difference (that is, this corresponds to the integrated value of a signal representative of the difference between the points of incidence of the above-described two light beams on the window 13a for the incident light). By detecting the level of this differentiated voltage appearing at the output terminal 10c, it is made possible to evaluate the distance to the target object as is aimed at by the apparatus of Japanese Patent Publication No. Sho 52-19091. Moreover, in this case, since the pulsated light signals are accumulated while being integrated, as has been described above, the many advantages including one that the detection performance is remarkably improved can be attained.

Figure 7:
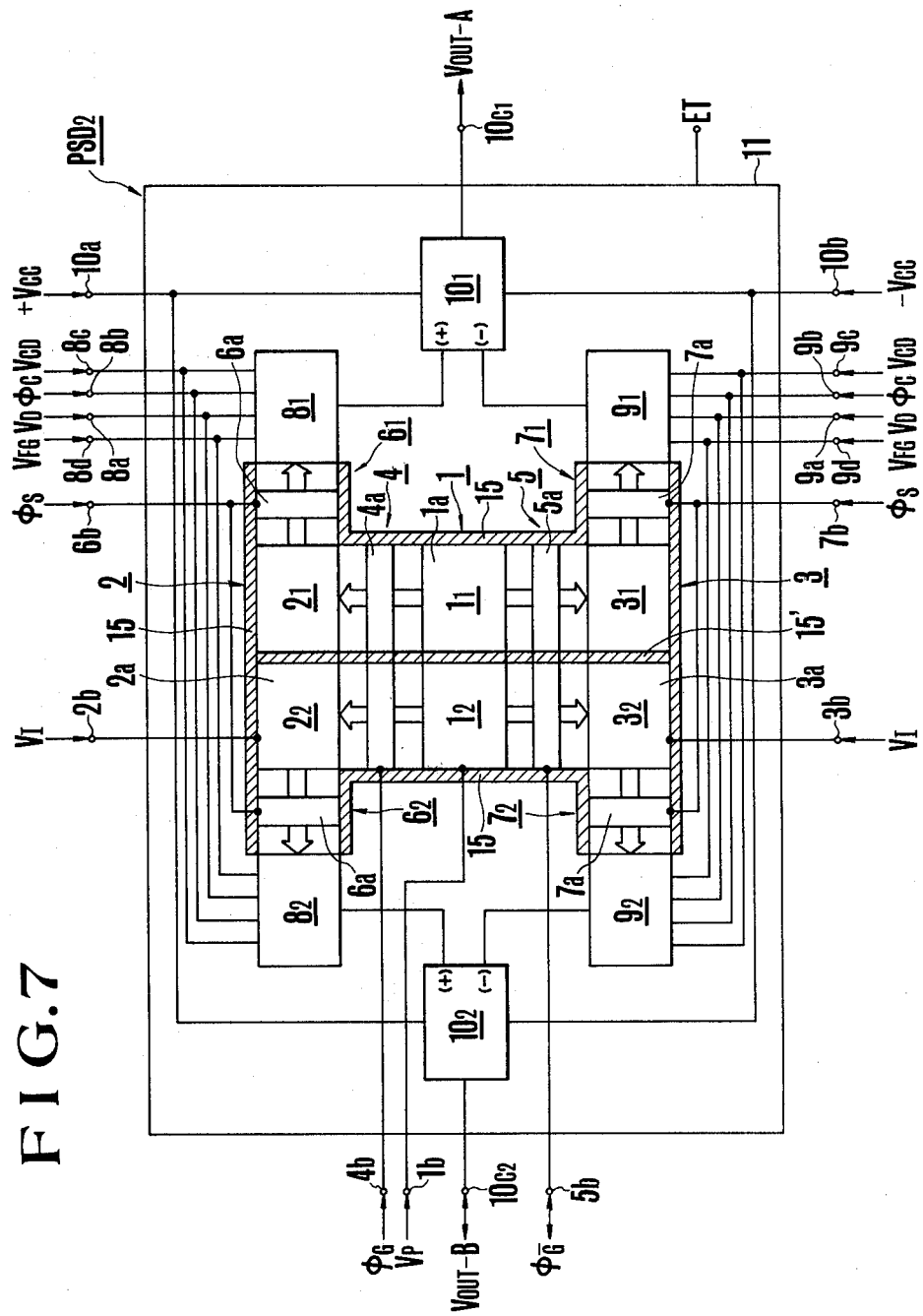
FIG. 7 is a schematic diagram illustrating a second embodiment of the present invention.

Referring to FIG. 7, there is shown a second embodiment of an optical sensor device according to the present invention. In this second embodiment, the number of sensor elements in the optical sensing region 1 is two, and therefore the corresponding number of storage elements in each of the first and second charge storing regions becomes two. As is understood from the drawing, the device is constructed as essentially comprising two optical sensor devices PSD$_1$ of FIG. 1 in symmetric combination. In FIG. 7, the parts denoted by the same reference characters with or without suffixes as those in FIGS. 1 and 2 are entirely the same or similar ones already mentioned. Explanation therefor is solely omitted unless a better understanding of this embodiment is hindered.

In FIG. 7, the optical sensor device of this second embodiment is generally indicated at PSD$_2$. It is here clarified that, as has been described above, the optical sensing region 1 is provided with two sensor elements 1$_1$ and 1$_2$, and the first and second charge storing regions 2 and 3 each are correspondingly provided with two elements 2$_1$ and 2$_2$, and 3$_1$ and 3$_2$. These sensor elements 1$_1$, 1$_2$ and storage elements 2$_1$, 2$_2$, 3$_1$, 3$_2$ are formed as separated by respective channel stoppers 15$_1$, and therefore the sensor elements 1$_1$ and 1$_2$ have a common electrode 1a, the storage elements 2$_1$ and 2$_2$ have a common electrode 2a, and the storage elements 3$_1$ and 3$_2$ have a common electrode 3a. Also, the first control gate region 4 has two gate elements divided by the channel stopper 15$_1$ to prevent migration of charges from occurring when they are transferred from the sensor elements 1$_1$, 1$_2$ to the respective storage elements 2$_1$, 2$_2$. The second control gate region 5 has, similarly, two gate elements.

The charges stored on the storage elements $2_1, 2_2, 3_1, 3_2$ are taken out through respective shift gate regions $6_1, 6_2, 7_1, 7_2$ and then converted to voltages by respective preamplifying regions $8_1, 8_2, 9_1, 9_2$, each of which is here of the floating gate amplification type (FGA type) having a voltage supply terminal 8d to which a D.C. bias voltage VFG (for example, 3.5 volts) for the floating gate region is applied. The differential amplifying region is also provided with two differential amplifiers $10_1$ and $10_2$. Of these, the first amplifier $10_1$ is fed at its non-inversion input with the output of the pre-amplifying region $8_1$ and at its inversion input with the output of the pre-amplifying region $9_1$, so that the voltage difference therebetween referred to as VOUT-A is produced from the terminal $10_{C1}$ and, on the other hand, the second differential amplifier $10_2$ is fed at its non-inversion input with the output of the pre-amplifying region $8_2$, and at its inversion input with the output of the pre-amplifying region $9_2$, so that the difference voltage therebetween referred to as VOUT-B is produced from the terminal $10_{C2}$.

As the signals VP, VI, $\phi G$, $\phi \overline{G}$, $\phi S$, VD, VCD and $\phi C$ for controlling the drive of the optical sensor device according to the second embodiment, use may be made of those for the optical sensor device $PSD_1$ according to the first embodiment.

In operating the optical sensor device of such construction, upon drive control by the above-described various signals in a similar manner to that described in connection with the optical sensor device $PSD_1$ of the first embodiment, the charge generated in the sensor element $1_1$ is accumulated on the storage elements $2_1$ and $3_1$ alternately, and, in the same timing as this, the charge generated in the sensor element $1_2$ is accumulated on the storage elements $2_2$ and $3_2$ in isolation from the former. Then, as has been mentioned above, the charges stored on the storage elements $2_1, 2_2, 3_1, 3_2$ are taken out through the shift gate regions $6_1, 6_2, 7_1, 7_2$ and are fed to the pre-amplifying regions $8_1, 8_2, 9_1, 9_2$ with production of voltages corresponding to the amounts of charge accumulated on the storage elements $2_1, 2_2, 3_1, 3_2$. Thus, the first differential amplifying region $10_1$ produces a voltage representative of the difference between the output voltages of the pre-amplifying regions $8_1$ and $9_1$, that is, the difference between the amounts of charge accumulated on the storage elements $2_1$ and $3_1$, this voltage being referred to as VOUT-A and appearing at the output terminal $10_{C1}$. On the other hand, the second differential amplifying region $10_2$ produces a voltage representative of the difference between the output voltages of the pre-amplifying regions $8_2$ and $9_2$, that is, the difference between the amounts of charge accumulated on the storage elements $2_2$ and $3_2$, this voltage VOUT-B appearing at the output terminal $10_{C2}$.

Therefore, this optical sensor device $PSD_2$ according to the second embodiment is found to be very suitable for use as the photoelectric light receptor in such automatic distance detecting and automatic in-focus detecting apparatus as disclosed in U.S. Pat. No. 3,999,192 assigned to the applicant of the present invention. In more detail, for example, the standard clock pulses from the oscillator OSC in the circuit of FIG. 5 may be utilized in controlling energization of the light projector in the apparatus, so that those of successive charges generated in the sensor element $1_1$ which occur when the light projector is energized can be accumulated on the storage element $2_1$, and the other on the storage element $3_1$, and the successive charges generated in the second sensor element $1_2$ can be accumulated on the storage elements $2_2$ and $3_2$ likewise in separation from each other depending upon the energization and de-energization of the light projector. Thus, the differential amplifier $10_1$ produces an output voltage representative of the charge corresponding purely only to the projection light at the sensor element $1_1$, and the differential amplifier $10_2$ produces an output voltage representative of the charge similarly corresponding purely only to the projection light at the second sensor element $1_2$. By making detectable whether or not these voltages coincide with each other, the distance detection or in-focus detection can be performed under the condition that the noise component due to the ambient light is perfectly removed, and, therefore, with an increased accuracy. Moreover, in this case, since there is the effect of integration and memorization of the signals, as has been mentioned above, many advantages including the one that the detection performance is remarkably improved can be attained.

Figure 8:
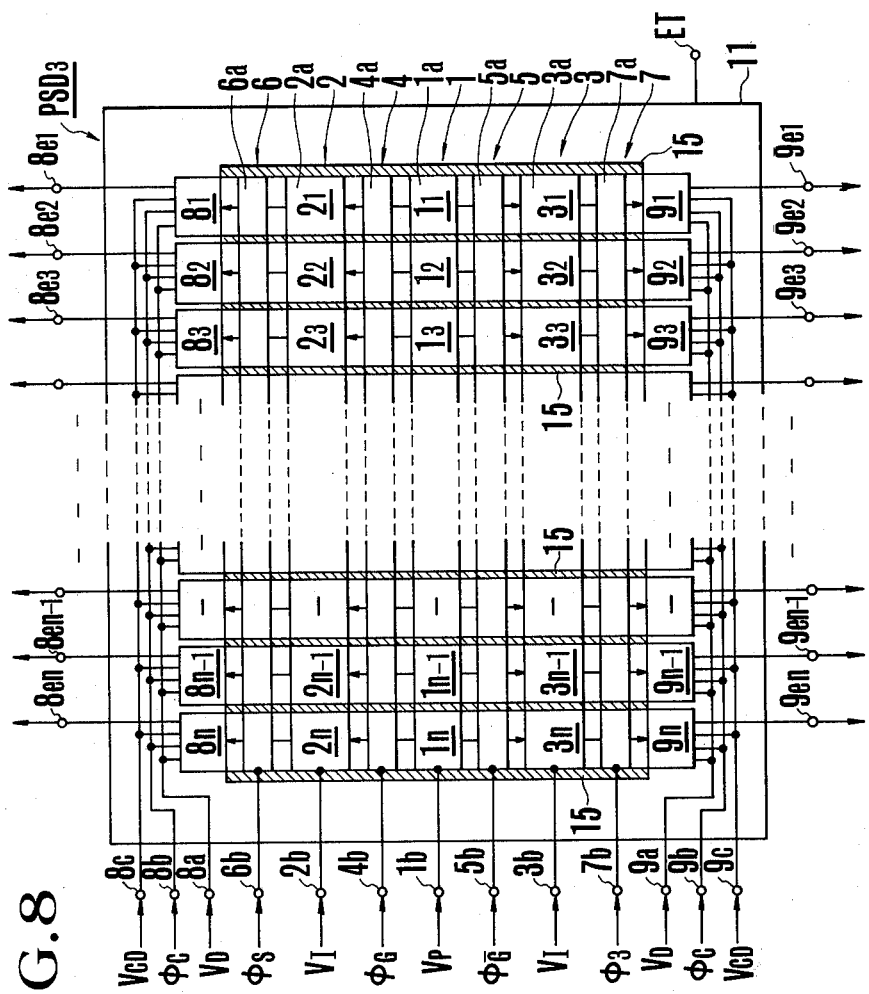
FIG. 8 is a schematic diagram illustrating a third embodiment of the present invention.

By reference to FIG. 8, a third embodiment of an optical sensor device according to the present invention will next be described. This third embodiment is characterized in that the number of sensor elements in the optical sensing region is further increased to n. In the drawing, said sensor device is generally indicated at $PSD_3$ and its optical sensing region 1 is provided with n sensor elements formed in isolation by the channel stoppers 15. Also, in correspondence to this, the first and second charge storing regions 2 and 3 each are provided with n storage elements $2_1$-$2_n$, $3_1$—$3_n$ formed in isolation by the stoppers 15, and, likewise, the first and second control gate regions 4 and 5 each are provided with n gate elements formed in isolation by the channel stoppers 15. It is also noticed that even the shift gate regions 6, 7 are provided with n gate elements formed in isolation by the channel stoppers 15, but with a common electrode 6a, 7a, and the above-described differential amplifying region is omitted. Therefore, the charges stored on the storage elements $2_1$-$2_n$ after having been converted to voltages by respective n pre-amplifiers $8_1$-$8_n$, and the charges stored on the storage elements $3_1$-$3_n$ after having been converted to voltages by respective n preamplifiers $9_1$-$9_n$ (these pre-amplifiers $8_1$-$8_n$ and $9_1$-$9_n$ are of the FDA type likewise as in the optical sensor device $PSD_1$ according to the first embodiment of FIG. 1) are read out in parallel through output terminals $8e1$-$8en$ and $9e1$-$9en$ respectively.

Again, in controlling the drive of this optical sensor devices $PSD_3$, use may be made of the above-described signals without further modification. If so, the corresponding operation is entirely the same as that in the foregoing embodiment except for the parallel production of the output voltages from the preamplifiers $8_1$-$8_n$ and $9_1$-$9_n$.

It will be appreciated that the optical sensor device according to this third embodiment is very suitable for use as the photoelectric light receptor, for example, in such distance measuring apparatus as proposed in Japanese Patent Laid-Open Specification Sho 49-49625 to the applicant of the present invention. In more detail, the n differential amplifiers shown in the embodiment of this Japanese Patent Laid-Open Specification are made to cooperate with the pre-amplifiers $8_1$-$8_n$ and $9_1$-$9_n$ in paired relation, and at the same time, the light projected from the light projector in this apparatus is made intermittent by utilizing the standard clock pulses from the oscillator OSC in the circuit of FIG. 5, while the repetition of projected lights corresponds to the frequency of the standard clock pulses. As those of the charges generated in each of the sensor elements $1_1$-$1_n$ which occur when light is projected are accumulated on the respective one of the storage elements $2_1$-$2_n$, and the other charges occurring when no light is projected on the respective storage elements $3_1$-$3_n$, voltages proportional to the charges generated in the individual sensor elements $1_1$, $1_2$, ... $1_n$ when light is projected, appear at the respective individual output terminals $8e1$, $8e2$, ... , $8en$ of the sensor device PSD$_3$, and voltages proportional to the charges generated in the individual sensor elements $1_1$, $1_2$, ..., $1_n$ when without the use of projected lights appear at the respective individual output terminals $9e1$, $9e2$, ..., $9en$. Therefore, at this time, the individual differential amplifiers produce voltages due to the charges generated in the individual sensor elements $1_1$, $1_2$, ..., $1_n$ in pure correspondence with only the projected light. As a result, the object of this Japanese Patent Laid-Open Specification No. Sho 49-49625 can be accomplished. Thus, the distance to the target object can be measured without disturbance of the ambient light, therefore, with high accuracy. Moreover, in this case, the provision of the effect of integration and memorization of the signals makes it possible to provide the above-described many advantages.

A fourth embodiment of an optical sensor device according to the present invention will next be described with reference to FIGS. 9 and 10. This fourth embodiment differs from the third embodiment in that, while the optical sensor device PSD$_3$ produces outputs due to the charges stored on the individual storage elements $2_1$, $2_2$, ..., $2_n$ and $3_1$, $3_2$, ..., $3_n$ in parallel relationship, they are produced in series, that is, in time sequential relationship by utilizing CCD analogue shift registers.

Figure 9:
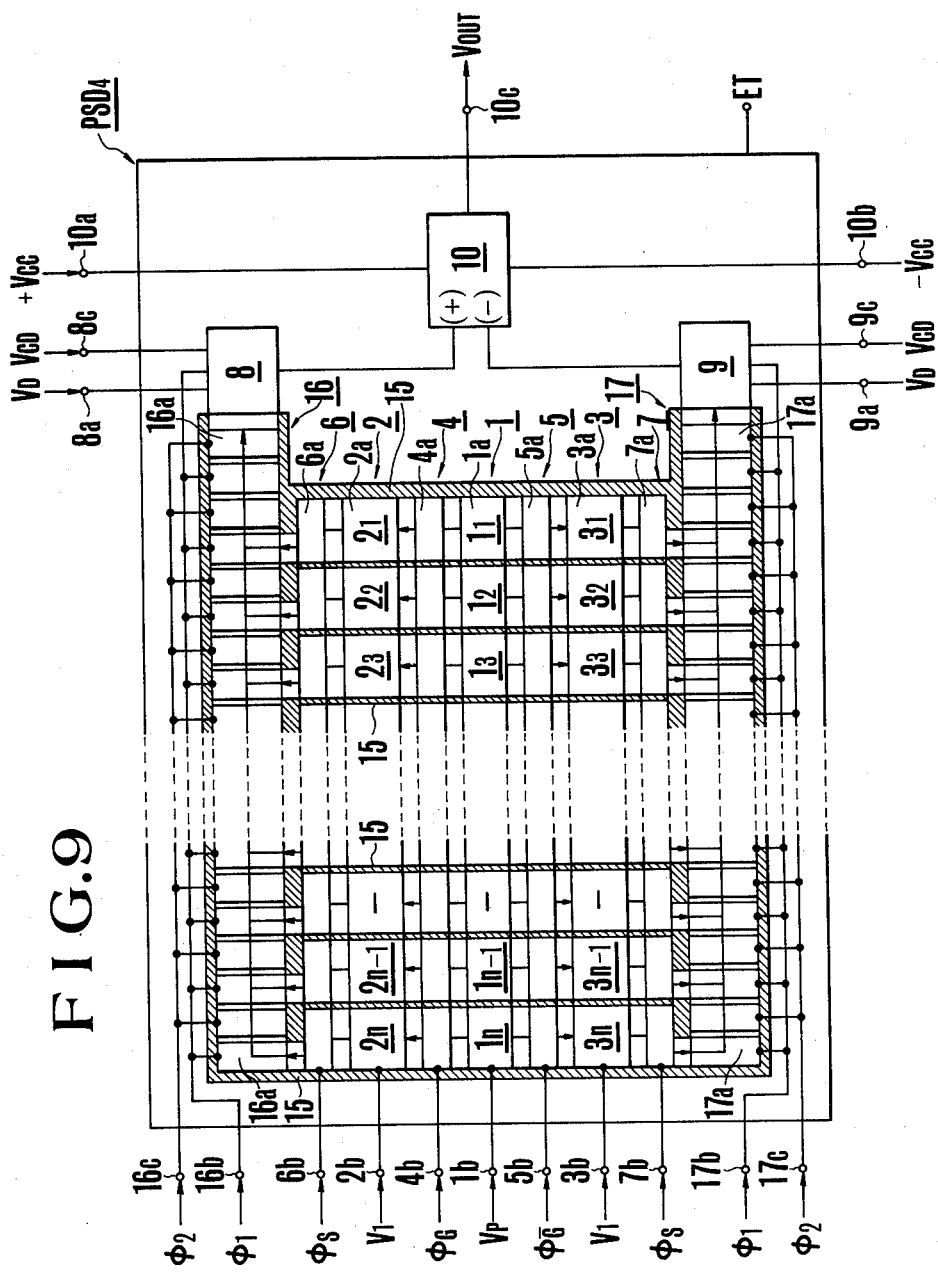
FIG. 9 is a similar diagram illustrating a fourth embodiment of the present invention.
Figure 10:
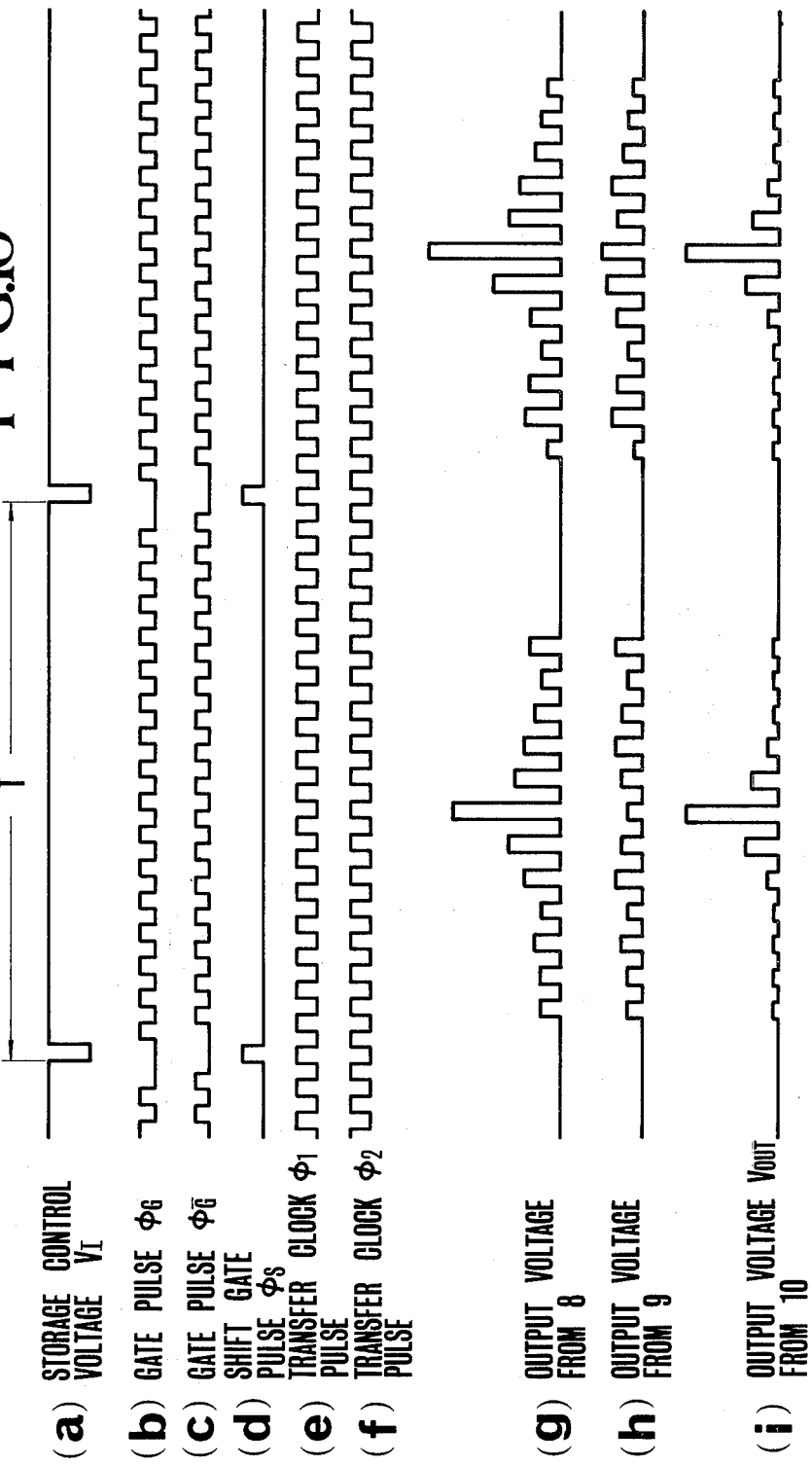
FIG. 10 is a timing chart of the signals necessary to drive the optical sensor device of FIG. 9 along with the output signals appearing at the essential portions of said optical sensor device.

In FIG. 9, the optical sensor device is generally indicated at PSD$_4$. As will be understood in comparison with FIG. 8, it is here noted that instead of the preamplifier rows $8_1$-$8_n$ and $9_1$-$9_n$, in the above described sensor device PSD$_3$, there are provided CCD analogue shift register regions 16 and 17 of the two-phase transfer type. The required number of bit elements in these shift register regions 16, 17 is optionally provided for more than $2_n$ as the number of sensor elements in the optical sensing region 1 is n, but is here assumed, for convenience, to be 2n+2. This sort of CCD analogue shift registers is well known in the art, and, therefore, detailed description of the practical structure thereof is solely omitted.

16a are individual electrodes to the respective bit elements in the first shift register region 16; 16b is a voltage supply terminal connected to electrodes of an even-numbered bit element group (for convenience, the counting is here made from the rightmost bit element as viewed in the drawing); 16c is a voltage supply terminal connected to an odd-numbered bit element group. Applied to the terminal 16b are transfer clock pulses $\phi_2$ (shown in FIG. 10(e), and to the terminal 16c are transfer clock pulses $\phi_2$ (in FIG. 10(f)).

17a are likewise individual electrodes to the respective bit elements in the second shift register region 17; 17b is a voltage supply terminal connected to electrodes of an even-numbered bit element group; 17c is a voltage supply terminal connected to an odd-numbered bit element group. The transfer clock pulses $\phi_1$ and $\phi_2$ are applied to the terminals 17b and 17c respectively.

Of these bit elements in the first shift register region 16, 1st, 2nd, 3rd, 5th, 7th, ..., (2n-3)th, (2n-1)th bit elements are electrically insulated from the first shift gate region 6 by the channel stoppers 15, so that the charges accumulated on the storage elements $2_1$, $2_2$, $2_3$, ..., 2n-1, 2n are taken out through said first shift gate region 6 to the 4th, 6th, 8th, ..., (2n-2)th, 2n-th bit elements. Also likewise, of the bit elements in the second shift register region 17, the 1st, 2nd, 3rd, 5th, 7th, ..., (2n-3)th, (2n-1)th bit elements are electrically insulated from the second shift gate region 7 by the channel stoppers 15, so that the charges accumulated on the storage elements $3_1$, $3_2$, $3_3$, ..., 3n-1, 3n are taken out through said second shift gate region 7 to the 4th, 6th, 8th, ..., (2n-2)th, 2n-th bit elements respectively. The above-described pre-amplifying regions 8 and 9 (both of which are here of FDA type) are respectively connected to the first and second shift register regions 16 and 17 at the head bit elements thereof. For the charge clear gate pulses ($\phi$C) for these pre-amplifying regions 8, 9, use is made of the clock pulses $\phi_1$.

In driving the optical sensor device PSD$_4$ of such construction, as is understood from the relationship of the pulses of FIGS. 10(a), (b), (c), the timing of dropping the storage control voltage VI to the low level and its period, and the timing of application of the shift gate pulse $\phi$S and its period are required to match one transfer clock pulse $\phi_1$, and the periodic time interval T is required to be more than 2n times the period of the transfer clock pulse $\phi_1$. Again, in this case, the timing of simultaneously maintaining the gate pulses $\phi$G, $\phi\overline{G}$ at the low level is also required to match the timing of the shift gate pulse $\phi$S. It is noted here that though the frequency of the gate pulses $\phi$G, $\phi\overline{G}$ is shown to match that of the transfer clock pulses $\phi_1$, $\phi_2$ in FIGS. 10(b), (c), this is not essential, so any variation may be made. The clock voltage (high level voltage) of the above-described transfer clock pulses $\phi_1$, $\phi_2$ may take, for example, 8 volts.

It is also noticed that the standard timing signals for the various drive signals shown in FIGS. 10(a)-(f) can be obtained by suitable modification of the circuit of FIG. 5.

When in driving the optical sensor device PSD$_4$ with such control signals, the charges accumulated on the storage elements $2_1$, $2_2$, ..., $2_n$ in the first charge storing region 2 are transferred in time sequential relation to the preamplifying region 8 through the first shift register region 16, and the charges accumulated on the storage elements $3_1$, $3_2$, ..., $3_n$ in the second charge storing region 3 are also transferred in similar relation to the pre-amplifying region 9 through the second shift register region 17. Therefore, the pre-amplifying region 8 produces outputs in the form of pulses having magnitudes corresponding to the amounts of charge accumulated on the storage elements $2_1$-$2_n$ and time-displaced in correspondence with the transfer clock pulses $\phi_2$, and the pre-amplifying region 9 also produces outputs in the form of pulses having voltages related to the amounts of charge accumulated on the storage elements $3_1$—$3_n$ and timedisplaced in correspondence with the transfer clock pulses $\phi_2$.

An example of combination of the output pulses from the pre-amplifying regions 8 and 9 along with the concurrent output pulses from the differential amplifier region 10 is shown in FIGS. 10(g), (h), (i) for the case where the optical sensor region 1 is exposed to a spot light of extremely limited incident area thereon under the consistent illumination with ambient light of certain level, while this spot light is made to function as intermittent projection lights by using the pulses shown in FIG. 10(c) (that is, the high level of this pulse leads to project light, and the low level to interrupt the light projection). The output of the pre-amplifying region 8 shown in FIG. 10(g) is responsible for the complex lighting of the projected light and the ambient light, while the output of the pre-amplifying region 9 shown in FIG. 10(h) is responsible for the ambient light alone. Thus, the differential amplifying region 10 produces an output responsible for only the projected light as the noise component of the output of the pre-amplifying region 8 due to the ambient light is removed, as shown in FIG. 10(i).

Finally, an example of application of the optical sensor device according to the fourth embodiment of the present invention to an active type automatic distance adjusting apparatus in a photographic camera or the like is described by reference to FIGS. 11 and 12.

Figure 11:
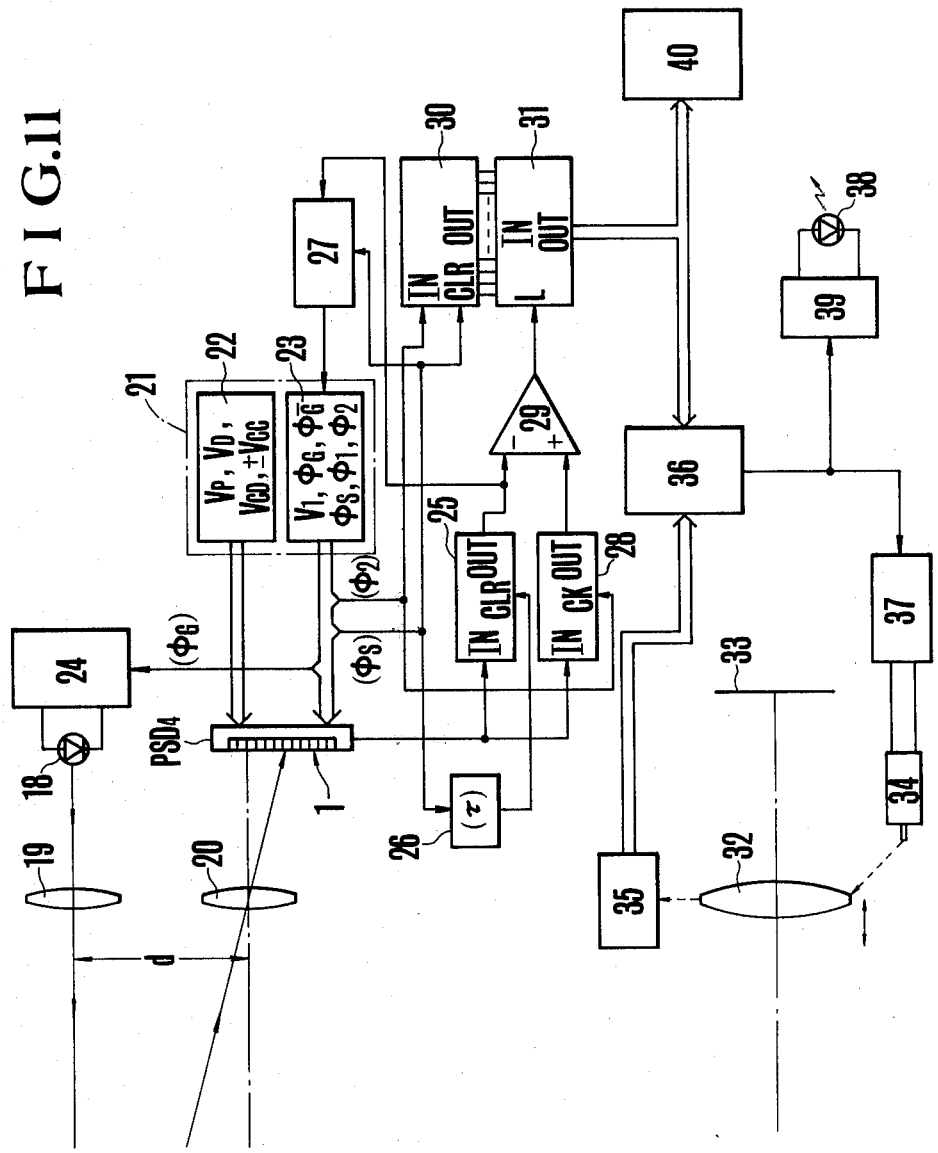
FIG. 11 is a schematic view, partly in circuit block form, illustrating an example of application of the optical sensor device of FIG. 9.

Referring first to FIG. 11, there is shown the circuitry of this apparatus. In the drawing, 18 is a light-emitting diode, or laser diode as the light projector, for providing infrared or near infrared light, for example,; 19 is a projection lens for collimating the rays of light from the energized light projector 18 to a beam of minute cross-sectional area which is to be aligned with an object to be photographed; 20 is a light collecting lens arranged in parallel with and spaced from the projection lens 19 by a predetermined optical base line distance, d, whereby, as is understood from the drawing, the above-described optical sensor device $PSD_4$ is arranged behind said light collecting lens 20 with its portion near the end disposed on the optical axis of the light collecting lens 20. With such projection and collection optical system, the light beam projected by the projection lens 19 onto the object after reflection therefrom returns to the light collecting lens 20 by which it is converged to the optical sensing region 1 at a location dependent upon the distance to the object (that is, it is here intended to detect the object distance from the position of convergence of the spot light on the optical sensing region 1).

21 is a sensor driver for controlling the drive of the optical sensor device $PSD_4$ consisting of a voltage supply circuit 22 for supplying the above described drive voltages VP, VD, VCD and ±VCC, and a drive circuit 23 for applying the above drive signals VI, $\phi G$, $\phi \overline{G}$, $\phi S$, $\phi_1$ and $\phi_2$ (shown in FIGS. 10(a)–(f). It is noted that the drive circuit 23 may be constructed from the timing circuit of FIG. 5 with suitable modification as has been mentioned above in combination with a voltage converting circuit for assurance of the various drive signals shown in FIGS. 10(a)–(f).

24 is a projection light control circuit responsive to the gate pulses $\phi G$, for example, from the above-described drive circuit 23 for controlling energization and de-energization of the light projector 18 in such a manner that, for example, when said pulse takes the high level, the light projector 18 is lit, and, when it takes the low level, the light is quenched; 25 is a peak hold circuit for holding the peak value of the output VOUT of the optical sensor device $PSD_4$ (that is, the output of the differential amplifying region 10); 26 is a delay circuit receptive of the shift gate pulses $\phi S$ for the optical sensor device $PSD_4$ from the drive circuit 23 for delaying this by a time $\tau$, the output of the delay circuit 26 being applied to said peak hold circuit 25 to clear the value held by said peak hold circuit 25; 27 is an integration time adjusting circuit for adjusting the integration time in the optical sensor device, that is, the charge accumulation time in the first and second charge storing regions 2 and 3 based on the peak value of the output of the optical sensor device $PSD_4$ held in the peak hold circuit 25. Responsive to the shift gate pulses $\phi S$, the circuit 27 takes in the output of the peak hold circuit 25 and controls the operation of the drive circuit 23 in such a manner that when this output exceeds a predetermined level, the periodic interval of the shift pulses $\phi S$ which are to be applied from the drive circuit 23 to the optical sensor device $PSD_4$ is shortened, and, conversely when this level range is not reached, this periodic interval is lengthened. 28 is a sample-and-hold circuit responsive to the above-described transfer clock pulses $\phi_2$ as sampling signals for sample-holding the output of the optical sensor device. 29 is a comparator for comparing the output of the sample-and-hold circuit 28 with the peak hold circuit 25 with its non-inversion input connected to the output of the sample hold circuit 28 and with its inversion input connected to the output of the peak hold circuit 25 so that when the output of the sample hold circuit 28 becomes lower than the output of the peak hold circuit 25, the output of the comparator 29 changes from the high to the low level. 30 is a binary counter of the falling synchronization type for counting number of the pulses $\phi_2$ fed from the drive circuit 23 to the optical sensor device $PSD_4$, being cleared by the falling edge of the above-described shift gate pulse $\phi S$. 31 is a latch circuit for latching the counted value of the counter 30 in response to the output of the above-described comparator 29. When the output of the comparator 29 changes from high to low level, therefore, the counted value of the counter 30 is latched by the latch circuit 31. Thus, the output of this latch circuit 31 serves as a signal representative of the convergence position of the reflected spot light from the object on the optical sensor region 1 by the light collecting lens 20, that is, the object distance; 32 is a photo-taking lens adjustable in position along the optical axis thereof; 33 is a film plane; 34 is an electric motor for driving the photo-taking lens 32 to effect distance adjustment; 35 is a position signal generating circuit for producing a digital signal representative of the position of the photo-taking lens 32 consisting of, for example, a gray code plate or potentiometer and an A-D converter; 36 is a digital comparator for comparing the digital output from said position signal generating circuit 35 with the digital output of the above-described latch circuit 31; 37 is a motor control circuit for controlling the above-described motor 34 based on the output of said comparator 36; 38 is an indicator such as a light-emitting diode for indicating the in-focus condition of the photo-taking lens 32; 39 is an indication control circuit for controlling the operation of the indicator 38 based on the output of the above-described comparator 36. 40 is a distance display device consisting of, for example, a decoder, driver and 7-segment LEDs for displaying the object distance based on the output of the above-described latch circuit 31.

The operation of the apparatus of such construction is as follows: when the camera is aligned with an object intended to be photographed, a power switch (not shown) is thrown to supply the automatic distance adjusting circuit with electrical power, thereby the sensor driver 21 is first actuated to start the drive of the optical sensor device $PSD_4$ as has been mentioned above. At this time, the gate pulses $\phi G$ (shown in FIG. 10(b)) from the driver circuit 23 in said sensor driver 21 are applied not only to the optical sensor device $PSD_4$, but also to the light projection control circuit 24, thereby said light projection control circuit 24 is allowed to cause the light projector 18 to produce light intermittently based on the gate pulses $\phi G$. Then, the light from the energized light projector 18 after being collimated by the projection lens 19 to a beam is projected onto the object, and the light reflected from the object is collected by the lens 20, converging to the optical sensing region 1 at a position corresponding to the distance from the camera to the object. During this time, since the first and second control gate regions 4, 5 are fed with the gate pulses $\phi G$ and $\phi \overline{G}$ respectively (FIGS. 10(b), (c)), those of a succession of charges generated in each of the sensor elements $1_1, 1_2, \ldots, 1_n$ which occur when the light projector 18 is energized are successively accumulated on the corresponding one of the storage elements $2_1, 2_2, \ldots, 2_n$, and the other successive charges on the storage elements $3_1, 3_2, \ldots, 3_n$. Then, in appropriate timed relationship therefrom, the drive circuit 23 produces a shift gate pulse $\phi S$ as shown in FIG. 12(a) (or FIG. 10(d)), causing the charges accumulated on the first and second charge storing regions 2 and 3 to be taken out through the first and second shift gate regions 6 and 7 and to be held in the first and second shift register regions 16 and 17 respectively. Then, they are transferred from the shift register regions 16 and 17 to the first and second pre-amplifying regions 8 and 9 respectively at a speed corresponding to the frequency of the transfer clock pulses $\phi_1$ and $\phi_2$ (FIGS. 10(e), (f)), where they are successively converted to voltages, and, therefore, the time-sequential output pulses corresponding to the condition of incidence of the reflected light from the object on the optical sensing region can be obtained in perfectly noise-free form due to the ambient light from the differential amplifying region 10.

It is noted that during the foregoing operation, the counter 30 is actuated by the falling edge of the shift gate pulse $\phi S$ so that the value so far counted is cleared up, and, after that, starts to count again the following transfer clock pulse $\phi_2$.

Then, the output of the optical sensor device PSD4 is applied to the peak hold circuit 25 and sample-and-hold circuit 28 which then produce output signals as shown in FIGS. 12(c) and (e). Then, these outputs of the peak hold circuit 25 and sample-and-hold circuit 28 are compared with each other by the comparator 29. At this time, if the output of the sample hold circuit 28 is larger than or equal to the output of the peak hold circuit 25 as shown in FIG. 12(f), a high level signal is produced from the comparator 29.

If it happens that the output of the sample hold circuit 28 is smaller than the output of the peak hold circuit 25, the output of the comparator 29 changes from the high to the low level at which the latch circuit 31 is actuated to latch the value counted to that time by the counter 30. Therefore, at this point in time, the latch circuit 31 produces a digital output signal representative of the convergence position of the reflected light from the object on the optical sensing region 1 of the optical sensor device PSD4 by the light collecting lens 20, that is, of the distance from the camera to the object. This output of the latch circuit 31 is applied to the distance display device 40 and the comparator 36, so that the consistent object distance is displayed by the distance display device 40, and, on the other hand, the output of the latch circuit 31 is compared with the output of the position signal generating circuit 35 by the comparator 36 upon occurrence of deviation therebetween to effect production of a signal of positive or negative sign.

Responsive to this positive or negative signal from the comparator 36, the motor control circuit 37 drives the motor 34 for rotation in forward or reversed direction, causing the photo-taking lens 32 to be axially moved. As the photo-taking lens moves, the output of the position signal generating circuit 35 varies and becomes coincident with the output of the latch circuit 31 at a time at which the motor 34 is stopped from further rotation by the motor control circuit 37. Thus, the photo-taking lens 32 is automatically focused correctly for the object. The coincidence signal from the comparator 36 is applied to the indication control circuit 39, so that the indicator 38 is energized, informing the photographer of the fact that the in-focus condition of the photo-taking lens is attained.

Since the foregoing operation is maintained continuous so long as the power switch is thrown, each time the drive circuit 23 produces one shift gate pulse $\phi S$, the counter 30 is cleared by the falling edge thereof, and the integration time adjusting circuit 27 receives the output of the peak hold circuit 25 occurring at this point of time (this is also the peak value of output of the optical sensor device), and determines whether or not this falls within the predetermined level range. Upon exceeding this range on the high side, the drive circuit 23 is controlled by integration time adjusting circuit 27 so as to shorten the periodic interval of the shift gate pulses $\phi S$; and upon exceeding the range on the low side, the circuit 27 lengthens the interval. Also the peak hold circuit 25 is cleared for every shift gate pulse $\phi S$ by the output of the delay circuit 26 shown in FIG. 12(d) after the elapse of the delay time $\tau$ from the production of that shift gate pulse $\phi S$, that is, after its output has been taken in the integration time adjusting circuit 27.

The use of the optical sensor device PSD4 of the present invention as the photo-electric light receptor in the automatic distance adjusting makes it possible to detect the object distance with very high accuracy because of the perfect removal of the noise component due to the ambient light, and, moreover to obtain the integration and memorization effect of the signals due to the accumulation of the charges which results in saving light energy from the light projector 18 and to extend the detectable range of object distances toward the longer side. Further, the accuracy of distance detection can be assured even when the ambient light is varied to a large extent. As a whole, the performance of the apparatus is remarkably improved.

As has been described above, according to the optical sensor device of the present invention, it is possible to read out the integrated signals for the two light beams in isolation from each other. As has been explained in connection with the various examples of apparatus, remarkable advantages can be obtained when applied to optical instruments where two light signals of different kind, or two light signals of the same kind are treated.

It is noticed that the use of the optical sensor device PSD4 according to the fourth embodiment shown in FIG. 9 even in such apparatus as proposed in the above-described U.S. Pat. No. 4,004,852 and the like besides the apparatus shown in FIG. 11 gives rise to very valuable advantages. In more detail, for example, the doubled images formed by the base line distance meter type optical system on the above-described optical sensor device PSD4 are intermittently blocked from the optical sensor device PSD4, and, at the same time, the operation of the control gate regions 4 and 5 is controlled in correspondence with the blocking repetition so that those of the charges generated in the individual sensor elements $1_1, 1_2, 1_3, \ldots, 1_n$ which occur when the images are formed thereon are accumulated on the first charge storing region 2 at the individual elements $2_1, 2_2, \ldots, 2_n$, and the charges generated when the image forming light beams are blocked are accumulated on the second charge storing region 3 at the individual elements $3_1, 3_2, \ldots, 3_n$. Since the charges stored on the second charge storing region 3 correspond to the dark current in this optical sensor device PSD$_4$, the time-sequential outputs obtained through the differential amplifying region 10 is perfectly free from this dark current to provide image scanning outputs corresponding purely to the pattern of the two images. Thus, the detection performance of this sort of apparatus is further improved to make it possible to achieve an increase in the accuracy of distance measurement.

Again, the optical sensor device PSD$_4$ according to the fourth embodiment of the present invention, aside from its use in such apparatus, is very suited for use in the apparatus proposed, for example, in Japanese Patent Laid-Open Specification Sho 49-90529 to the applicant of the present invention. In more detail, this Japanese Patent Laid-Open Specification discloses one embodiment where two images formed by the base line distance meter type optical system are allowed to alternately impinge upon a common photoelectric element array with the resultant scanning outputs for these two images providing information representative of the amount of deviation to these two images from each other. This photoelectric element array can be replaced by the above-described optical sensor device PSD$_4$, and the operation of the first and second control gate regions is controlled in correspondence with the alternate formation of the two images so that the charges for one image are accumulated on the first charge storing region 2, and those for the other are accumulated on the second charge storing region 3. Then, the scanning outputs for the two images can be obtained through the first and second pre-amplifying regions 8 and 9 simultaneously and in separation from each other (in this case, the differential amplifying region 10 may be omitted). Accordingly, the circuitry of the apparatus in this embodiment is simplified, and the detection performance is further improved. This provides the advantage that the deviation of the two images in position from each other can be detected with greater accuracy.

What is claimed is:

1. An apparatus for processing a light signal intermittently incident on an image sensor which produces an electric charge, comprising:
   (a) first memory means operatively connected to the image sensor for storing a quantity of the electric charges produced by the image sensor;
   (b) second memory means operatively connected to the image sensor for storing a quantity of the electric charges produced by the image sensor;
   (c) first control gate means connected between the image sensor and the first memory means for permitting transfer of said electric charge to the first memory means during a certain interval when the light signal incident on the image sensor is present;
   (d) second control gate means connected between the image sensor and the second memory means for permitting transfer of said electric charge to the second memory means during a certain interval when the light signal incident on the image sensor is absent; and
   (e) comparison means operatively connected to the first and second memory means for producing an electrical output signal corresponding to the difference between the electric charges stored in said first and second memory means.

2. An apparatus for producing a light signal intermittently incident on an image sensor which produces an electric charge, comprising:
   (a) first memory means operatively connected to the image sensor for storing a quantity of the electric charges produced by the image sensor;
   (b) second memory means operatively connected to the image sensor for storing a quantity of the electric charges produced by the image sensor;
   (c) first control gate means connected between the image sensor and the first memory means for permitting transfer of said electric charge to the first memory means while the light signal incident on the image sensor is present;
   (d) second control gate means connected between the image sensor and the second memory means for permitting transfer of said electric charge to the second memory means while the light signal incident on the image sensor is absent; and
   (e) comparison means operatively connected to the first and second memory means for producing an electrical output signal corresponding to the difference between the electric charges stored in said first and second memory means.

3. An apparatus for processing a light signal intermittently incident on an image sensor which produces an electric charge, comprising:
   (a) first memory means operatively connected to the image sensor for storing a quantity of the electric charges produced by the image sensor during a certain interval when the light signal falls on the image sensor;
   (b) second memory means operatively connected to the image sensor for storing a quantity of the electric charges produced by the image sensor during a certain interval in the absence of the incident light signal; and
   (c) comparison means operatively connected to the first and second memory means for producing an electrical output signal corresponding to the difference between the electric charges stored in said first and second memory means.

4. An apparatus for producing a light signal intermittently incident on an image sensor which produces an electric charge, comprising:
   (a) first memory means operatively connected to the image sensor for storing a quantity of the electric charges produced by the image sensor while the light signal falls on the image sensor;
   (b) second memory means operatively connected to the image sensor for storing a quantity of the electric charges produced by the image sensor in the absence of the incident light signal; and
   (c) comparison means operatively connected to the first and second memory means for producing an electrical output signal corresponding to the difference between the electric charges stored in said first and second memory means.

5. An apparatus for processing a light signal intermittently incident on an image sensor which produces an electric signal, comprising:

(a) first means operatively connected to the image sensor for detecting a quantity of the electric signals produced by the image sensor during a certain interval when the light signal falls on the image sensor;
(b) second means operatively connected to the image sensor for detecting a quantity of the electric signals produced by the image sensor during a certain interval in the absence of the incident light signal; and
(c) output means operatively connected to the first and second means for producing an electrical output signal corresponding to the difference between the electric signals detected by the first and second means.

6. An apparatus according to claim 5, wherein said output means includes a comparison circuit having a first input operatively connected to the output of said first means and a second input operatively connected to the output of said second means.

7. An apparatus according to claim 6, wherein said comparison circuit includes a differential amplifying part.

8. An apparatus for processing a light signal intermittently incident on an image sensor which produces an electric charge, comprising:
(a) first memory means operatively connected to the image sensor for storing a quantity of the electric charges produced by the image sensor;
(b) second memory means operatively connected to the image sensor for storing a quantity of the electric charges produced by the image sensor;
(c) first control gate means connected between the image sensor and the first memory means for permitting transfer of said electric charge to the first memory means during a certain interval when the light signal incident on the image sensor is present;
(d) second control gate means connected between the image sensor and the second memory means for permitting transfer of said electric charge to the second memory means during a certain interval when the light signal incident on the image sensor is absent;
(e) comparison means operatively connected to the first and second memory means for producing an electrical output signal corresponding to the difference between the electric charges stored in said first and second memory means;
(f) third control gate means for transferring a quantity of the electric charges stored in the first memory means to said comparison means when the first control gate means have repeated a plurality of transfer operations, said gate means being inserted between said first memory means and said comparison means; and
(g) fourth control gate means for transferring a quantity of the electric charges stored in the second memory means to said comparison means when the second control gate means have repeated a plurality of transfer operations.

9. An apparatus according to claim 8, wherein said comparison means includes a differential amplifying circuit.

* * * * *